(12) United States Patent
Taniguchi et al.

(10) Patent No.: US 10,476,471 B2
(45) Date of Patent: Nov. 12, 2019

(54) COMPOSITE DEVICE

(71) Applicant: Murata Manufacturing Co., Ltd., Nagaokakyo-shi, Kyoto-fu (JP)

(72) Inventors: Yasumasa Taniguchi, Nagaokakyo (JP); Masashi Omura, Nagaokakyo (JP); Takashi Yamane, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 16/056,580

(22) Filed: Aug. 7, 2018

(65) Prior Publication Data

US 2019/0097599 A1    Mar. 28, 2019

(30) Foreign Application Priority Data

Sep. 26, 2017 (JP) ................................ 2017-184690

(51) Int. Cl.
*H01L 41/083* (2006.01)
*H03H 9/02* (2006.01)
(Continued)

(52) U.S. Cl.
CPC ..... *H03H 9/02086* (2013.01); *H01L 23/3107* (2013.01); *H01L 23/481* (2013.01); *H01L 23/5226* (2013.01); *H01L 23/62* (2013.01); *H01L 27/20* (2013.01); *H01L 41/0472* (2013.01); *H01L 41/0475* (2013.01); *H01L 41/0477* (2013.01); *H01L 41/0533* (2013.01); *H01L 41/083* (2013.01); *H01L 41/183* (2013.01); *H01L 41/1873* (2013.01); *H03H 9/0211* (2013.01); *H03H 9/02102* (2013.01); *H03H 9/02574* (2013.01); *H03H 9/02834* (2013.01); *H03H 9/02984* (2013.01); *H03H 9/0504* (2013.01); *H03H 9/059* (2013.01); *H03H 9/0542* (2013.01); *H03H 9/0557* (2013.01); *H03H 9/1071* (2013.01); *H03H 9/132* (2013.01); *H03H 9/14541* (2013.01); *H03H 9/176* (2013.01); *H01L 24/13* (2013.01);
(Continued)

(58) Field of Classification Search
CPC ......... H01L 21/02109; H01L 21/02436; H01L 21/02496; H01L 41/02; H01L 41/16; H01L 41/35; H01L 41/47
See application file for complete search history.

(56) References Cited

U.S. PATENT DOCUMENTS 6,285,866 B1    9/2001 Lee et al.
2018/0159497 A1    6/2018 Iwamoto et al.

FOREIGN PATENT DOCUMENTS

JP    06-120416 A    4/1994
JP    2000-151451 A    5/2000
(Continued)

*Primary Examiner* — Cheung Lee
(74) *Attorney, Agent, or Firm* — Keating & Bennett, LLP

(57) ABSTRACT

A composite device includes a silicon substrate including first and second main surfaces on opposite sides, a semiconductor device adjacent to at least one of the first and second main surfaces, and an acoustic wave device including a silicon oxide film directly or indirectly disposed on the first main surface of the silicon substrate, a piezoelectric layer directly disposed on the silicon oxide film, and an IDT disposed on the piezoelectric layer. The piezoelectric layer has a thickness of not greater than about 2.5λ where λ is a wavelength defined by an electrode finger pitch of the IDT.

20 Claims, 7 Drawing Sheets

(51) Int. Cl.
*H03H 9/05* (2006.01)
*H01L 41/047* (2006.01)
*H03H 9/17* (2006.01)
*H01L 27/20* (2006.01)
*H01L 23/62* (2006.01)
*H01L 23/31* (2006.01)
*H01L 23/522* (2006.01)
*H01L 41/187* (2006.01)
*H01L 41/053* (2006.01)
*H03H 9/13* (2006.01)
*H01L 41/18* (2006.01)
*H01L 23/48* (2006.01)
*H03H 9/10* (2006.01)
*H03H 9/145* (2006.01)
*H01L 29/866* (2006.01)
*H01L 23/00* (2006.01)
*H03H 9/64* (2006.01)

(52) U.S. Cl.
CPC ............ *H01L 24/14* (2013.01); *H01L 29/866* (2013.01); *H01L 2224/12105* (2013.01); *H01L 2224/13025* (2013.01); *H01L 2224/13101* (2013.01); *H01L 2224/1403* (2013.01); *H01L 2924/12035* (2013.01); *H01L 2924/16235* (2013.01); *H03H 9/64* (2013.01)

(56) References Cited

FOREIGN PATENT DOCUMENTS

| | | |
|---|---|---|
| JP | 2006-005433 A | 1/2006 |
| JP | 2006-121357 A | 5/2006 |
| WO | 2017/043427 A1 | 3/2017 |

COMPOSITE DEVICE

CROSS REFERENCE TO RELATED APPLICATIONS

This application claims the benefit of priority to Japanese Patent Application No. 2017-184690 filed on Sep. 26, 2017. The entire contents of this application are hereby incorporated herein by reference.

BACKGROUND OF THE INVENTION

1. Field of the Invention

The present invention relates to a composite device.

2. Description of the Related Art

In an RF front portion of a cellular phone, a semiconductor device, such as a power amplifier, a low noise amplifier, and a switch, and an acoustic wave device, such as an RF filter and a duplexer that use an acoustic wave, are modularized in many cases. Japanese Unexamined Patent Application Publication No. 6-120416 discloses one example of a composite device including a semiconductor device and a surface acoustic wave device. In this composite device, a field effect transistor (FET), which is a semiconductor device, is disposed in a semiconducting substrate formed of silicon (Si). A surface acoustic wave device is disposed on the semiconducting substrate.

The semiconductor device is an active device and generates heat when driven. Furthermore, the acoustic wave device, such as a surface acoustic wave device, generates heat when driven, mainly at a portion including an IDT. The composite device described in Japanese Unexamined Patent Application Publication No. 6-120416 has a smaller size since the acoustic wave device is disposed on the semiconducting substrate formed of silicon and including the semiconductor device therein. However, the acoustic wave device receives not only heat generated by the acoustic wave device itself but also heat generated by the semiconductor device, which causes a frequency change and an insertion loss change in the acoustic wave device, and thus degrades the properties, such as receiving sensitivity.

SUMMARY OF THE INVENTION

Preferred embodiments of the present invention provide composite devices in each of which the properties of the acoustic wave device are not degraded although the acoustic wave device is disposed on a silicon substrate including a semiconductor device therein.

A composite device according to a preferred embodiment of the present invention includes a silicon substrate including a first main surface and a second main surface opposed to the first main surface, a semiconductor device disposed adjacent to at least one of the first main surface and the second main surface of the silicon substrate, and an acoustic wave device including a silicon oxide film directly or indirectly disposed on the first main surface of the silicon substrate, a piezoelectric layer directly disposed on the silicon oxide film, and an IDT disposed on the piezoelectric layer. The piezoelectric layer has a thickness of not greater than about 2.5λ, where λ is a wavelength defined by an electrode finger pitch of the IDT.

A composite device according to a preferred embodiment of the present invention may further include a via electrode electrically connected to the IDT and extending through the silicon substrate. In this configuration, the heat generated by the acoustic wave device is quickly released toward the silicon substrate and the outside through the via electrode. Thus, the heat generated by the acoustic wave device is unlikely to be transferred to the semiconductor device, which results in less degradation of the properties of the semiconductor device.

In a composite device according to a preferred embodiment of the present invention, the acoustic wave device may include a first wiring electrode electrically connected to the IDT. The semiconductor device may include a functional electrode and a second wiring electrode electrically connected to the functional electrode. The first wiring electrode and the second wiring electrode do not overlap in plan view. In this configuration, stray capacitance is less likely to exist. Thus, the properties of the acoustic wave device and the semiconductor device are further less likely to be degraded.

In a composite device according to a preferred embodiment of the present invention, the semiconductor device may be disposed adjacent to the first main surface of the silicon substrate, and a shield electrode may be disposed on the second main surface of the silicon substrate over at least an area overlapping the semiconductor device in plan view. With this configuration, the properties of the semiconductor device are unlikely to be degraded.

In a composite device according to a preferred embodiment of the present invention, the silicon substrate may include a recess including an opening in the first main surface. The semiconductor device may be disposed in the recess. The silicon oxide film may cover the recess and the semiconductor device. This configuration does not require a separate protective film covering the semiconductor device, which improves the productivity while protecting the semiconductor device from being damaged.

In a composite device according to a preferred embodiment of the present invention, the semiconductor device may be disposed adjacent to the first main surface of the silicon substrate, and a resin sealing layer may be disposed on the first main surface of the silicon substrate and may cover the semiconductor device and the acoustic wave device.

A composite device according to a preferred embodiment of the present invention may further include a first via electrode electrically connected to the IDT and extending through the resin sealing layer, and a second via electrode electrically connected to the semiconductor device and extending through the resin sealing layer. The second via electrode may have a larger width than the first via electrode in a width direction extending transversely across the first via electrode and the second via electrode. In this configuration, the heat generated by the semiconductor device is efficiently released to the outside. Thus, the heat generated by the semiconductor device is unlikely to be transferred to the acoustic wave device, resulting in even less degradation of the properties of the acoustic wave device.

A composite device according to a preferred embodiment of the present invention may further include a first via electrode electrically connected to the IDT and extending through the resin sealing layer, a second via electrode electrically connected to the semiconductor device and extending through the resin sealing layer, a first bump connected to the first via electrode, and a second bump connected to the second via electrode. The second bump may have a larger width than the first bump in a width direction extending transversely across the first via electrode and the second via electrode. In this configuration, the heat generated by the semiconductor device is efficiently released to the outside. Thus, the heat generated by the semiconductor device is unlikely to be transferred to the acoustic wave device, resulting in even less degradation of the properties of the acoustic wave device.

In a composite device according to a preferred embodiment of the present invention, the semiconductor device may be disposed adjacent to the second main surface of the silicon substrate, and the semiconductor device and the acoustic wave device may overlap in plan view. This configuration enables a reduction in the size of the composite device.

In a composite device according to a preferred embodiment of the present invention, an acoustic velocity of a bulk wave propagating through the silicon substrate may be higher than an acoustic velocity of an acoustic wave propagating through the piezoelectric layer, and an acoustic velocity of a bulk wave propagating through the silicon oxide film may be lower than the acoustic velocity of the acoustic wave propagating through the piezoelectric layer. With this configuration, energy of the acoustic wave is efficiently confined in the piezoelectric layer.

A composite device according to a preferred embodiment of the present invention may further include a high acoustic velocity film between the silicon substrate and the silicon oxide film. An acoustic velocity of a bulk wave propagating through the high acoustic velocity film may be higher than an acoustic velocity of an acoustic wave propagating through the piezoelectric layer, and an acoustic velocity of a bulk wave propagating through the silicon oxide film may be lower than the acoustic velocity of the acoustic wave propagating through the piezoelectric layer. With this configuration, energy of the acoustic wave is efficiently confined in the piezoelectric layer.

A composite device according to a preferred embodiment of the present invention may further include an acoustic reflection layer including a low-acoustic-impedance layer having relatively low acoustic impedance and a high-acoustic-impedance layer having relatively high acoustic impedance. The acoustic reflection layer may be disposed between the silicon substrate and the piezoelectric layer. The acoustic reflection layer may include the silicon oxide film. In this configuration, energy of the acoustic wave is efficiently confined in the piezoelectric layer.

In a composite device according to a preferred embodiment of the present invention, the piezoelectric layer may be made of lithium tantalate.

In a composite device according to a preferred embodiment of the present invention, the silicon substrate may have a thickness of not less than about 3λ. With this configuration, a higher-order mode is sufficiently reduced or prevented.

In a composite device according to a preferred embodiment of the present invention, the silicon substrate may have a thickness of not less than about 10λ. With this configuration, the higher-order mode is more sufficiently reduced or prevented.

In a composite device according to a preferred embodiment of the present invention, the silicon substrate may have a thickness of not greater than about 180 μm, and the wavelength λ may be not greater than about 18 μm. With this configuration, the composite device has sufficient heat dissipation characteristics and a reduced height.

Preferred embodiments of the present invention provide composite devices in each of which the properties of an acoustic wave device are not deteriorated although the acoustic wave device is disposed on a silicon substrate including a semiconductor device therein.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention are described with reference to the drawings to clarify the present invention.

It should be noted that the preferred embodiments described herein are merely examples. The components are interchangeable among the preferred embodiments or may be used in different combinations.

Figure 1:
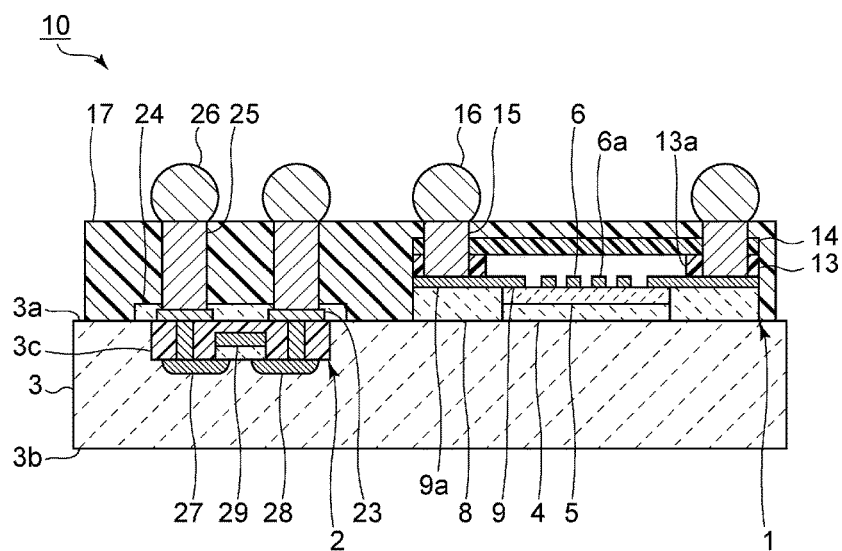
FIG. 1 is a front cross-sectional view schematically illustrating a composite device according to a first preferred embodiment of the present invention.

FIG. 1 is a front cross-sectional view schematically illustrating a composite device according to a first preferred embodiment of the present invention.

A composite device 10 includes a silicon substrate 3. The silicon substrate 3 is preferably a substrate mainly made of silicon (Si), for example. The substrate mainly made of silicon (Si) has a silicon content of about 50% or more, for example. The silicon substrate 3 includes a first main surface 3a and a second main surface 3b opposed to the first main surface 3a. The composite device 10 includes a semiconductor device 2 disposed adjacent to the first main surface 3a of the silicon substrate 3 and an acoustic wave device 1 disposed on the first main surface 3a of the silicon substrate 3.

The acoustic wave device 1 according to the present preferred embodiment includes a silicon oxide film 4 directly disposed on the first main surface 3a. The silicon oxide is represented as $SiO_x$. The silicon oxide film 4 of the acoustic wave device 1 is preferably made of $SiO_2$, for example. The material of the silicon oxide film 4 is not limited to $SiO_2$ and $x$ may be a real number other than 2.

A piezoelectric layer 5 is directly disposed on the silicon oxide film 4. The piezoelectric layer 5 is preferably made of lithium tantalate ($LiTaO_3$), for example. Although the cut-angle of the piezoelectric layer 5 may be any value, the cut-angle is preferably about 50°, for example, in the present preferred embodiment. The piezoelectric layer 5 may be made of piezoelectric single crystal other than lithium tantalate, e.g., lithium niobate. The piezoelectric layer 5 may be made of a piezoelectric ceramic material selected from ZnO, AlN, and PZT, for example.

Figure 2:
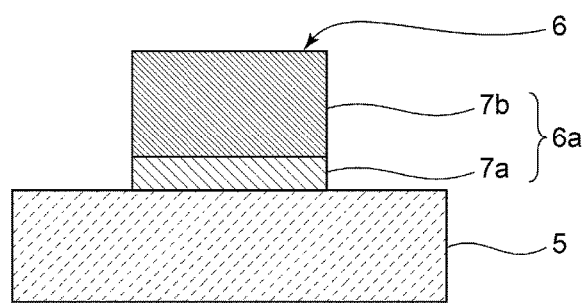
FIG. 2 is a front cross-sectional enlarged view schematically illustrating an electrode finger of an IDT in the first preferred embodiment of the present invention.

An interdigital transducer (IDT) 6 is disposed on the piezoelectric layer 5. The IDT 6 includes a plurality of electrode fingers 6a. An acoustic wave is excited when an AC voltage is applied to the IDT 6. As illustrated in an enlarged view of FIG. 2, the IDT 6 includes a first metal layer 7a on the piezoelectric layer 5 and a second metal layer 7b on the first metal layer 7a. The first metal layer 7a and the second metal layer 7b are preferably respectively made of Ti and Al, for example. The materials of the IDT 6 are not limited to the above. The IDT 6 may include laminated metal films or a single metal film.

The IDT 6 may be indirectly disposed on the piezoelectric layer 5 with a film, such as a silicon oxide film, for example, therebetween.

Figure 3:
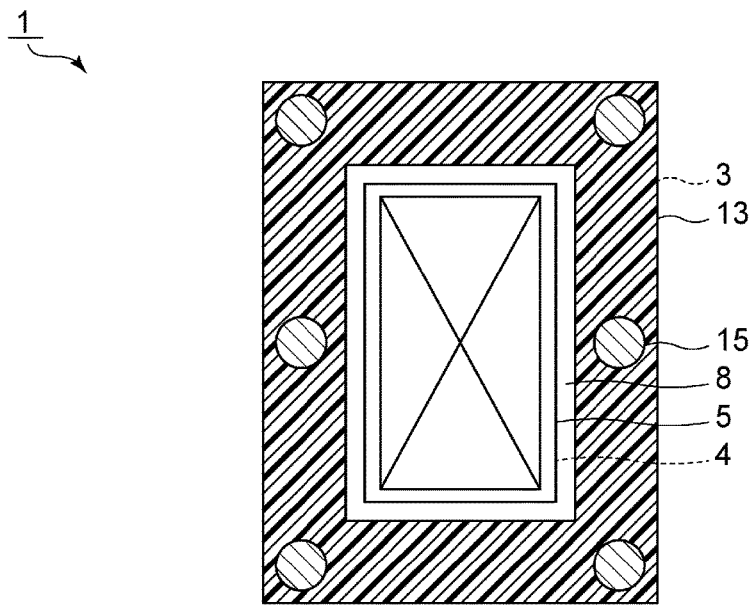
FIG. 3 is a simplified plane cross-sectional view schematically illustrating an acoustic wave device according to the first preferred embodiment of the present invention.

FIG. 3 is a simplified plane cross-sectional view schematically illustrating an acoustic wave device according to the first preferred embodiment. The cross-sectional view in FIG. 3 is taken along a line passing through a supporting member, which is described later. In the simplified view in FIG. 3, a circuit including the IDT is indicated by a rectangle with two diagonal lines. A first wiring electrode, which is described later, is not illustrated in FIG. 3.

As illustrated in FIG. 1 and FIG. 3, the acoustic wave device 1 includes a support 8 on the first main surface 3a of the silicon substrate 3 such that the support 8 surrounds the silicon oxide film 4 and the piezoelectric layer 5 in plan view. In the present preferred embodiment, the support 8 is preferably made of silicon oxide, for example, although the material of the support 8 is not limited to silicon oxide. The support 8 may be integral with the silicon oxide film 4 or the support 8 and the silicon oxide film 4 may be separate members.

As illustrated in FIG. 1, a first wiring electrode 9 electrically connected to the IDT 6 is disposed on the piezoelectric layer 5. The first wiring electrode 9 extends from the piezoelectric layer 5 to the support 8. The first wiring electrode 9 includes an electrode land 9a located on the support 8.

A supporting member 13 covering the electrode land 9a is disposed on the support 8. The supporting member 13 includes an opening 13a surrounding the IDT 6 in plan view. The supporting member 13 is preferably made of a suitable resin, for example.

A cover 14 covering the opening 13a is disposed on the supporting member 13. The IDT 6 is disposed in a space defined by the piezoelectric layer 5, the support 8, the supporting member 13, and the cover 14.

A first via electrode 15 extends through the cover 14 and the supporting member 13 and includes an end connected to the electrode land 9a. The first via electrode 15 is electrically connected to the IDT 6 via the first wiring electrode 9. Here, the composite device 10 includes a sealing resin layer 17 on the first main surface 3a of the silicon substrate 3. The sealing resin layer 17 covers the acoustic wave device 1 and the semiconductor device 2. The first via electrode 15 of the acoustic wave device 1 extends through the sealing resin layer 17 in addition to the cover 14 and the supporting member 13. Furthermore, a first bump 16 is connected to the other end of the first via electrode 15. The first bump 16 is preferably made of solder, for example.

The IDT 6 is electrically connected to an external device via the first wiring electrode 9, the first via electrode 15, and the first bump 16. The acoustic wave device 1 of this preferred embodiment preferably has a wafer-level package (WLP) structure, for example.

In the present preferred embodiment, when the wavelength determined by the electrode finger pitch of the IDT 6 is defined as X, preferably, the thickness of the silicon substrate 3 is about 62.5λ, the thickness of the silicon oxide film 4 is about 0.335λ, and the thickness of the piezoelectric layer 5 is about 0.3λ, for example. The wavelength λ of the acoustic wave device 1 is preferably about 2 μm, for example. However, the thicknesses and the wavelength λ are not limited to the above values.

As illustrated in FIG. 1, the silicon substrate 3 includes a recess 3c including an opening in the first main surface 3a. The semiconductor device 2 is disposed in the recess 3c. In the recess 3c, a functional electrode including a source electrode 27, a gate electrode 29, and a drain electrode 28 is disposed. The semiconductor device 2 is preferably an FET, for example, including the functional electrode. The semiconductor device 2 may be a semiconductor device other than the FET.

A protective film 24 covering the recess 3c and the semiconductor device 2 is disposed on the first main surface 3a of the silicon substrate 3. The protective film 24 is preferably made of silicon oxide, for example. The protective film 24 may be made of a suitably selected dielectric material other than silicon oxide.

The semiconductor device 2 fits in the recess 3c of the silicon substrate 3 in the present preferred embodiment, but the semiconductor device 2 may be disposed on the first main surface 3a. Nevertheless, the semiconductor device 2 fitted in the recess 3c is unlikely to be damaged and enables a reduction in size of the composite device 10.

A second via electrode 25 extends through the protective film 24 and the sealing resin layer 17 and includes an end electrically connected to the functional electrode of the semiconductor device 2. A second bump 26 is connected to the other end of the second via electrode 25. The second bump 26 is preferably made of solder, for example. The semiconductor device is electrically connected to an external device through the second via electrode 25 and the second bump 26. When the composite device 10 is mounted on a target, such as a mounting board, the sealing resin layer 17 is disposed on the mounting board.

In the present preferred embodiment, one silicon substrate 3, the acoustic wave device 1, and the semiconductor device 2 define the composite device 10. The composite device 10 includes the silicon oxide film 4 on the silicon substrate 3, the piezoelectric layer 5 directly on the silicon oxide film 4, and the IDT 6 on the piezoelectric layer 5. The thickness of the piezoelectric layer 5 is preferably not greater than about 2.5λ, for example. With this configuration, the properties of the acoustic wave device 1 included in the composite device 10 are unlikely to be degraded. This advantage is described in detail below.

As described above, in a composite device including an acoustic wave device and a semiconductor device, the acoustic wave device receives not only heat generated by the acoustic wave device itself but also heat generated by the semiconductor device. However, in the composite device 10 according to the present preferred embodiment, the acoustic wave device 1 is less affected by the heat.

Figure 4:
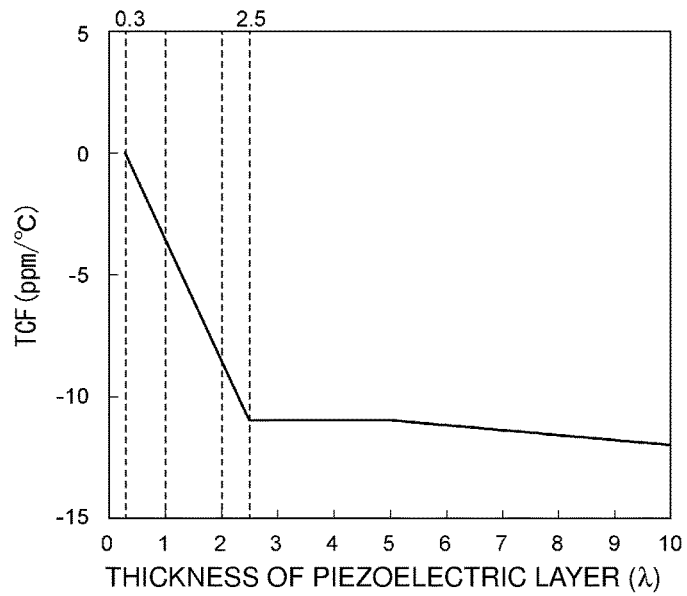
FIG. 4 is a diagram illustrating relationships between the thickness of the piezoelectric layer and temperature coefficients of frequency (TCF).

FIG. 4 is a diagram indicating relationships between the thickness of the piezoelectric layer and temperature coefficients of frequency (TCF).

As indicated in FIG. 4, the absolute value of the temperature coefficient of frequency (TCF) is small when the thickness of the piezoelectric layer 5 is not greater than about 2.5λ compared to when the thickness of the piezoelectric layer 5 is greater than about 2.5λ. Thus, a frequency change and an insertion loss change are efficiently reduced in the composite device 10 including the acoustic wave device 1 that receives a lot of heat. Thus, in the composite device 10 according to the present preferred embodiment that includes the acoustic wave device 1 on the silicon substrate 3 including the semiconductor device 2 therein, the properties of the acoustic wave device 1 are unlikely to be degraded.

The thickness of the piezoelectric layer 5 is preferably not greater than about 2λ, for example. This lowers the absolute value of the temperature coefficient of frequency (TCF) to less than about 10 ppm/° C., efficiently leading to less degradation of the properties of the acoustic wave device 1 of the composite device 10. The thickness of the piezoelectric layer 5 is more preferably not greater than about 1λ, for example. This lowers the absolute value of the temperature coefficient of frequency (TCF) to less than about 5 ppm/° C., for example. Thus, the properties of the acoustic wave device 1 are further less likely to be degraded. The thickness of the piezoelectric layer 5 is still more preferably not greater than about 0.3λ, for example. This lowers the temperature coefficient of frequency (TCF) to almost zero. Thus, the properties of the acoustic wave device 1 are still further less likely to be degraded.

If the acoustic wave device 1 is likely to be greatly affected by heat, the distance between the semiconductor device 2 and the acoustic wave device 1 is required to be long to reduce the heat transfer from the semiconductor device 2 to the acoustic wave device 1. In contrast, in the first preferred embodiment illustrated in FIG. 1, the acoustic wave device 1 is unlikely to be affected by heat, enabling the semiconductor device 2 and the acoustic wave device 1 to be located close to each other. This configuration enables a reduction in size of the composite device 10.

The semiconductor device 2 includes a second wiring electrode 23 electrically connected to the functional electrode. In the present preferred embodiment, the first wiring electrode 9 of the acoustic wave device 1 and the second wiring electrode 23 of the semiconductor device 2 do not overlap in plan view. Thus, stray capacitance is unlikely to exist, and the properties of the acoustic wave device 1 and the semiconductor device 2 are further less likely to be degraded.

Figure 5:
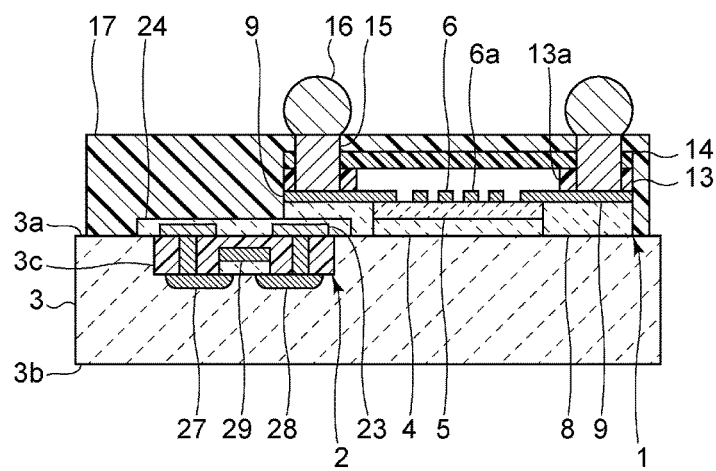
FIG. 5 is a front cross-sectional view schematically illustrating a composite device according a first modification of the first preferred embodiment of the present invention.

FIG. 5 is a front cross-sectional view schematically illustrating a composite device according to a first modification of the first preferred embodiment of the present invention.

In this modification, a portion of the support 8 is disposed on the protective film 24. The first wiring electrode 9 of the acoustic wave device 1 and the second wiring electrode 23 of the semiconductor device 2 overlap in plan view. This configuration enables a further reduction in size of the composite device. In the present modification, the semiconductor device 2 is electrically connected to an external device at a portion not illustrated in FIG. 5. For example, a wire may be provided to electrically connect the semiconductor device 2 and the external device.

In the first preferred embodiment illustrated in FIG. 1, preferably, an acoustic velocity of a bulk wave propagating through the silicon substrate 3 is higher than an acoustic velocity of an acoustic wave propagating through the piezoelectric layer 5. An acoustic velocity of the bulk wave propagating through the silicon oxide film 4 is lower than the acoustic velocity of the acoustic wave propagating through the piezoelectric layer 5. The silicon substrate 3, the silicon oxide film 4, and the piezoelectric layer 5 having such acoustic velocity relationships are laminated in this order. This configuration efficiently confines the energy of the acoustic wave in the piezoelectric layer 5. The acoustic velocity relationship among the silicon substrate 3, the silicon oxide film 4, and the piezoelectric layer 5 is not limited to the above-described relationship.

In the acoustic wave device 1, response by a plurality of higher-order modes is large in some cases. This results from the higher-order modes being confined in the piezoelectric layer 5, for example. In the first preferred embodiment, such higher-order modes are reduced or prevented. This is described below referring to phases of the first and second higher-order modes as the plurality of higher-order modes.

Figure 6:
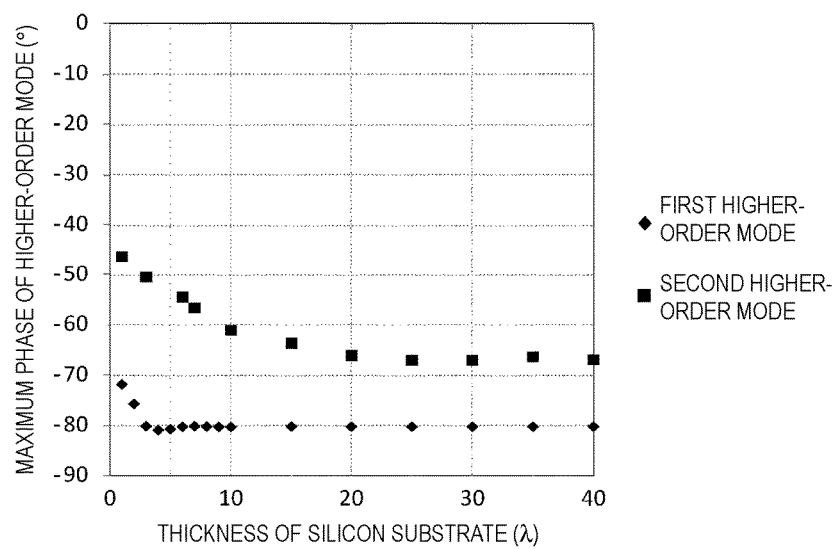
FIG. 6 is a diagram illustrating relationships between the thickness of the silicon substrate and maximum phases of a first higher-order mode and a second higher-order mode.

FIG. 6 indicates relationships between the thickness of the silicon substrate and the maximum phases of the first higher-order mode and the second higher-order mode.

As indicated in FIG. 6, the maximum phases of the first higher-order mode and the second higher-order mode decrease as the thickness of the silicon substrate 3 increases. The maximum phase of the first higher-order mode is sufficiently small when the thickness of the silicon substrate 3 is about 3λ or more, for example and stays substantially constant. Furthermore, the second higher-order mode is sufficiently reduced or prevented when the thickness of the silicon substrate 3 is about 10λ or more, for example. In view of the above, the thickness of the silicon substrate 3 is preferably not less than about 10λ, and more preferably not less than about 20λ, for example. This configuration sufficiently reduces or prevents both of the first higher-order mode and the second higher-order mode.

In the silicon substrate 3 having a thickness within the above range, the acoustic velocity of the bulk wave propagating through the silicon substrate 3 is lower than the acoustic velocity of the first higher-order mode and the acoustic velocity of the second higher-order mode propagating through the piezoelectric layer 5. This configuration enables the first higher-order mode and the second higher-order mode to leak to the silicon substrate 3, to reduce the response of the first higher-order mode and the second higher-order mode.

The silicon substrate 3 preferably has a thickness of not greater than about 180 μm, for example. With this configuration, the composite device 10 has sufficient heat dissipation characteristics and a small height. In the first preferred embodiment, since the wavelength λ is about 2 μm, the thickness of the silicon substrate 3 is preferably not greater than about 90λ, for example. The thickness of the silicon substrate 3 of the composite device 10 is preferably about 62.5λ, for example, which falls in the range of not less than about 10λ and not greater than about 90λ, for example. With this configuration, the higher-order mode is reduced or prevented and the composite device 10 has sufficient heat dissipation characteristics and a small height. When the thickness of the silicon substrate 3 is not less than about 10λ and not greater than about 180 μm, the wavelength λ may be any value not greater than about 18 μm, for example.

Second to fourth modifications of the first preferred embodiment of the present invention are described below. In the second to fourth modifications, the thickness of the silicon oxide film is preferably not greater than about 2.5λ, for example, as in the first preferred embodiment. Thus, the properties of the acoustic wave device are unlikely to be degraded.

Figure 7:
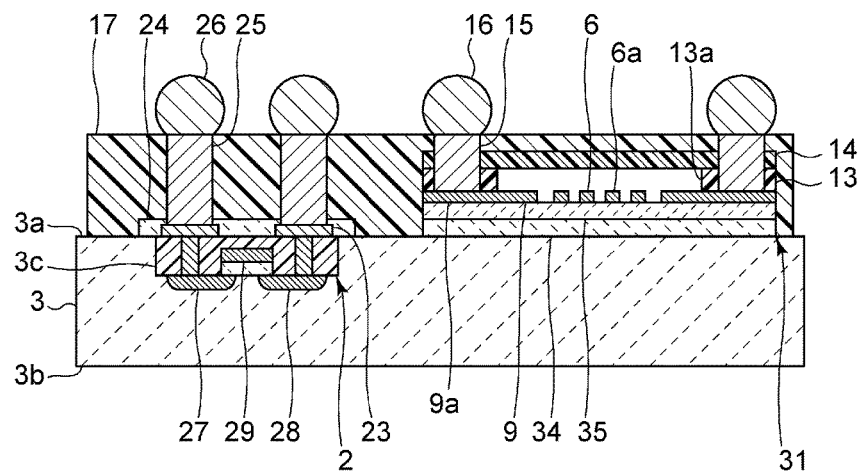
FIG. 7 is a front cross-sectional view schematically illustrating a composite device according to a second modification of the first preferred embodiment of the present invention.

FIG. 7 is a front cross-sectional view schematically illustrating a composite device according to a second modification of the first preferred embodiment of the present invention.

In the second modification, the electrode land 9a and the supporting member 13 are disposed on a laminate of a silicon oxide film 34 and a piezoelectric layer 35. Specifically, the electrode land 9a and the supporting member 13 are disposed on the piezoelectric layer 35 of the laminate. As can be seen from the second modification, the support 8 may be eliminated from an acoustic wave device 31. The composite device in the second modification has the same or substantially the same configuration as the composite device 10 in the first preferred embodiment except for as described above.

Figure 8:
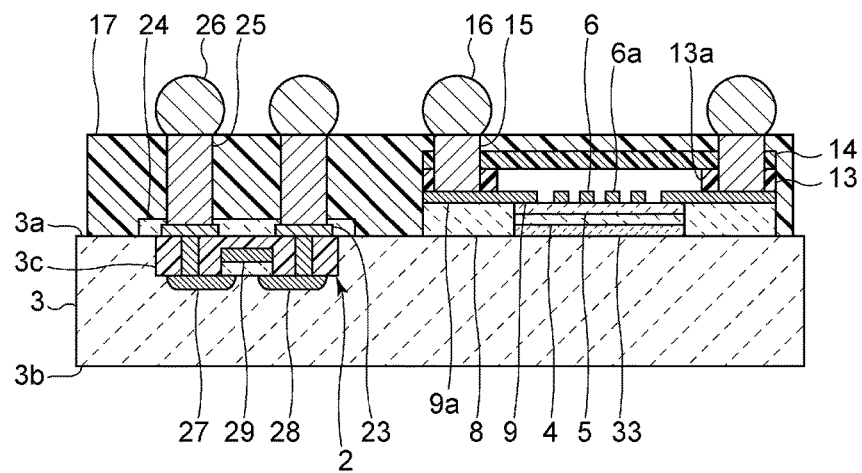
FIG. 8 is a front cross-sectional view schematically illustrating a composite device according to a third modification of the first preferred embodiment of the present invention.

FIG. 8 is a front cross-sectional view schematically illustrating a composite device according to a third modification of the first preferred embodiment of the present invention.

The third modification includes a high acoustic velocity film 33 between the silicon substrate 3 and the silicon oxide film 4. The silicon oxide film 4 is indirectly disposed on the silicon substrate 3 with the high acoustic velocity film 33 therebetween. In the high acoustic velocity film 33, a bulk wave propagates at a higher acoustic velocity than an acoustic wave propagating in the piezoelectric layer 5. The high acoustic velocity film 33 may be made of a piezoelectric material, such as aluminum nitride, aluminum oxide, silicon carbide, silicon nitride, silicon oxynitride, silicon, DLC, sapphire, lithium tantalate, lithium niobate, and crystal, a ceramic material such as alumina, zirconia, cordierite, mullite, steatite, and forsterite, diamond, magnesia, a material including the above material as a main component, or a material including a mixture of the above materials as a main component. The material of the high acoustic velocity film 33 may be any relatively high acoustic velocity material. The composite device of the third modification has the same or substantially the same configuration as the composite device 10 in the first preferred embodiment except for as described above.

In the third modification, the acoustic velocity of the bulk wave propagating through the silicon oxide 4 is lower than the acoustic velocity of the acoustic wave propagating through the piezoelectric layer 5. Since the high acoustic velocity film 33, the silicon oxide film 4, and the piezoelectric layer 5 are laminated in this order, the energy of the acoustic wave is efficiently confined in the piezoelectric layer 5.

Figure 9:
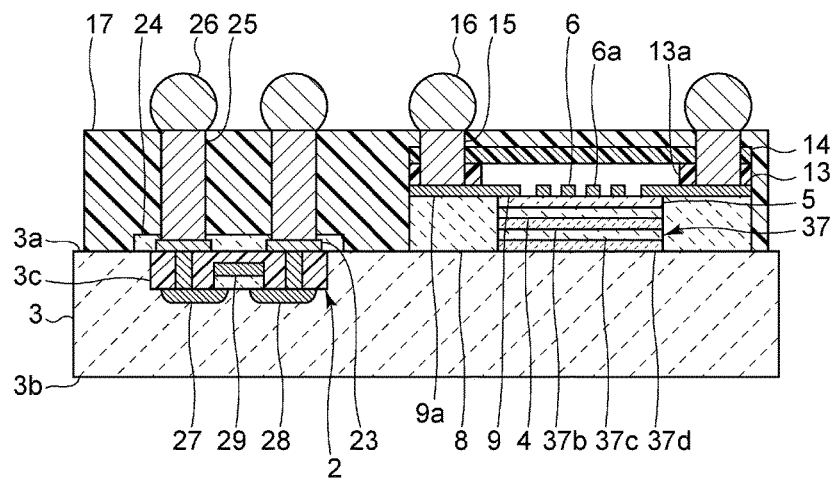
FIG. 9 is a front cross-sectional view schematically illustrating a composite device according to a fourth modification of the first preferred embodiment of the present invention.

FIG. 9 is a front cross-sectional view schematically illustrating a composite device according to a fourth modification of the first preferred embodiment of the present invention.

The fourth modification includes an acoustic reflection layer 37 between the silicon substrate 3 and the piezoelectric layer 5. The acoustic reflection layer 37 is a laminate of low-acoustic-impedance layers and high-acoustic-impedance layers. The acoustic impedance of the low-acoustic-impedance layers is lower than that of the high-acoustic-impedance layers. The acoustic reflection layer 37 includes the silicon oxide film 4 as a layer closest to the piezoelectric layer 5. In the fourth modification, the silicon oxide film 4 is one of the low-acoustic-impedance layers, although preferred embodiments of the present invention are not limited to this configuration. Specifically, the acoustic reflection layer 37 includes the silicon oxide layer 4, a high-acoustic-impedance layer 37b, a low-acoustic-impedance layer 37c, and the high-acoustic-impedance layer 37d in this order. The composite device of the fourth modification has the same or substantially the same configuration as the composite device 10 in the first preferred embodiment except for as described above.

Since the fourth modification includes the acoustic reflection layer 37, the energy of the acoustic wave is efficiently confined in the piezoelectric layer 5.

It is preferable that the high-acoustic-impedance layers and the low-acoustic-impedance layers are alternately laminated. This provides interfaces between the high-acoustic-impedance layers and the low-acoustic-impedance layers, efficiently reflecting the acoustic wave toward the piezoelectric layer 5. In the fourth modification, the number of layers of the high-acoustic-impedance layers and the low-acoustic-impedance layers in the acoustic reflection layer 37 is preferably four in total, for example, but the number is not limited to four. The number of layers may be five or more in total.

Figure 10:
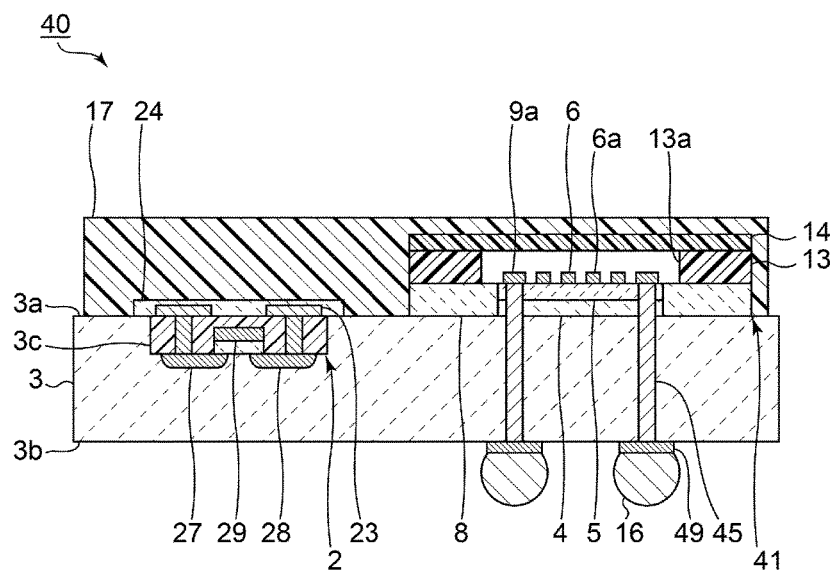
FIG. 10 is a front cross-sectional view schematically illustrating a composite device according to a second preferred embodiment of the present invention.

FIG. 10 is a front cross-sectional view schematically illustrating a composite device according to a second preferred embodiment of the present invention.

The second preferred embodiment differs from the first preferred embodiment in the configuration of an acoustic wave device 41 and how the composite device 40 is mounted on a target, such as a mounting board. The composite device 40 of the second preferred embodiment has the same or substantially the same configuration as the composite device 10 of the first preferred embodiment except as described above.

In the acoustic wave device 41, the electrode land 9a is disposed on the piezoelectric layer 5. The electrode land 9a is connected to an end of a substrate via electrode 45 extending through the piezoelectric layer 5, the silicon oxide film 4, and the silicon substrate 3. Furthermore, a terminal electrode 49 is disposed on the second main surface 3b of the silicon substrate 3. The substrate via electrode 45 is connected to the terminal electrode 49 at the other end. The terminal electrode 49 is connected to the first bump 16. When the composite device 40 of the present preferred embodiment is mounted on a target, such as a mounting board, the second main surface 3b of the silicon substrate 3 is disposed on the mounting board. The semiconductor device 2 is electrically connected to an external device at a portion not illustrated in FIG. 10.

In the present preferred embodiment, the electrode land 9a may be positioned on the support 8 as in the first preferred embodiment. In such a case, the substrate via electrode 45 may extend through the support 8 and the silicon substrate 3.

In the composite device 40, heat generated by the acoustic wave device 41 is released through the substrate via electrode 45 to the silicon substrate 3 and the outside. Thus, the heat generated by the acoustic wave device 41 is unlikely to be transferred to the semiconductor device 2, leading to less degradation of the properties of the semiconductor device 2. In the present preferred embodiment that has the above-described high heat dissipation properties, the thickness of the silicon oxide film 4 is preferably not greater than about 2.5λ, for example, as in the first preferred embodiment. Thus, the properties of the acoustic wave device 41 are further less likely to be degraded.

The first preferred embodiment may include the substrate via electrode of the second preferred embodiment connected to the electrode land that is positioned at a portion not illustrated in FIG. 1. In such a case, the substrate via electrode may be used as a heat dissipation member, not as an electrode connected to an external device. The terminal electrode connected to the substrate via electrode in the second preferred embodiment may also be used as a heat dissipation member in the first preferred embodiment. This improves the heat dissipation properties, leading to less degradation of the properties of the acoustic wave device and the semiconductor device. The electrode land to which the substrate via electrode is connected is preferably an electrode land connected to a ground potential or a floating electrode electrically connected to the IDT.

Figure 11:
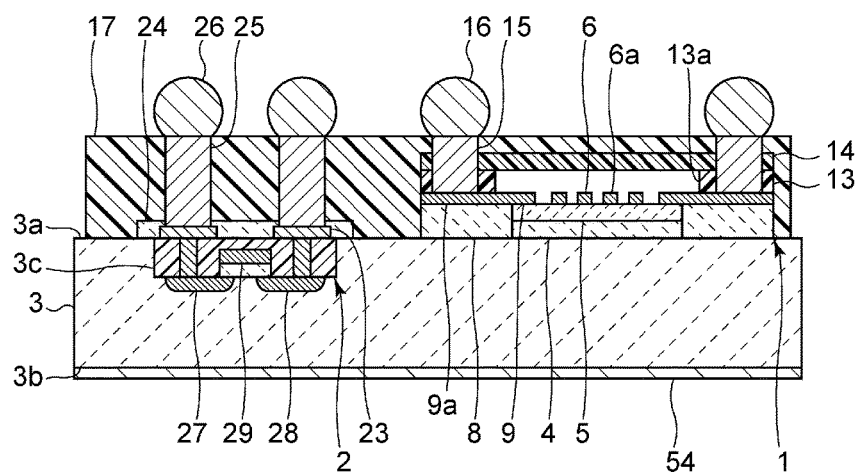
FIG. 11 is a front cross-sectional view schematically illustrating a composite device according to a third preferred embodiment of the present invention.

FIG. 11 is a front cross-sectional view schematically illustrating a composite device according to a third preferred embodiment of the present invention.

The third preferred embodiment differs from the first preferred embodiment in that a shield electrode 54 is disposed on the second main surface 3b of the silicon substrate 3. The composite device of the third preferred embodiment has the same or substantially the same configuration as the composite device 10 of the first preferred embodiment except for as described above.

The shield electrode 54 is connected to a ground potential to shield an outside electrical field. The shield electrode 54 has a higher heat dissipation rate than the silicon substrate 3, because the shield electrode 54 is preferably made of metal. In the third preferred embodiment, the shield electrode 54 is disposed over the entire or substantially the entire area of the second main surface 3b. This efficiently improves the heat dissipation properties. Thus, the properties of the semiconductor device 2 are less likely to be degraded. In the present preferred embodiment having the high heat dissipation properties, the thickness of the silicon oxide film 4 is preferably not greater than about 2.5λ, for example as in the first preferred embodiment. Thus, the properties of the acoustic wave device 1 are further less likely to be degraded.

The shield electrode 54 may be disposed over a portion of the second main surface 3b. In such a case, the shield electrode 54 is preferably disposed on the second main surface 3b over a portion overlapping the semiconductor device 2 in plan view. This configuration efficiently dissipates the heat generated by the semiconductor device 2. Thus, the heat generated by the semiconductor device 2 is unlikely to be transferred to the acoustic wave device 1, resulting in less degradation of the properties of the acoustic wave device 1.

The third preferred embodiment may include the substrate via electrode of the second preferred embodiment. On the second main surface 3b of the silicon substrate 3, the shield electrode 54 is not necessarily disposed over the substrate via electrode. Alternatively, the substrate via electrode and the shield electrode 54 may be connected to each other. If the substrate via electrode and the shield electrode 54 are connected to each other, the electrode land to which the substrate via electrode is connected may be an electrode land connected to a ground potential or a floating electrode.

Figure 12:
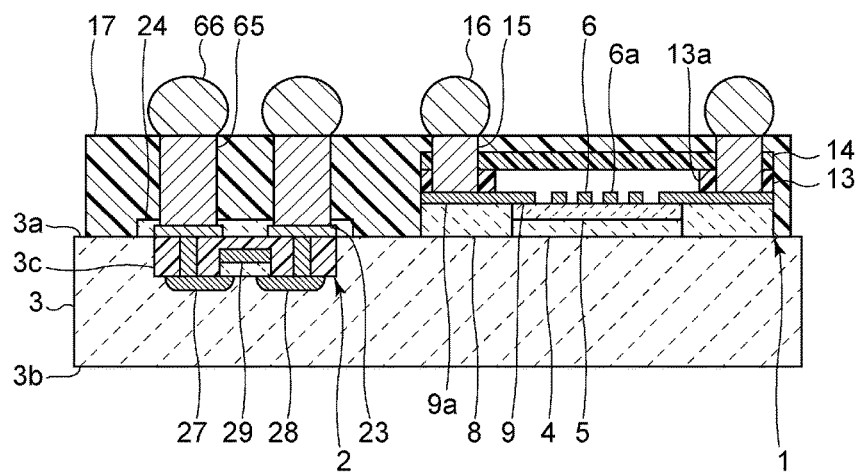
FIG. 12 is a front cross-sectional view schematically illustrating a composite device according to a fourth preferred embodiment of the present invention.

FIG. 12 is a front cross-sectional view schematically illustrating a composite device according to a fourth preferred embodiment of the present invention.

The fourth preferred embodiment differs from the first preferred embodiment in the width of each of a second via electrode 65 and a second bump 66. Herein, the width direction is a direction extending across the first via electrode 15 or the second via electrode 65 in a transverse direction. The width is a length in the width direction. The fourth preferred embodiment has the same or substantially the same configuration as the composite device 10 of the first preferred embodiment except for as described above.

Specifically, the width of the second via electrode 65 is larger than that of the first via electrode 15. The width of the second bump 66 connected to the second via electrode 65 is larger than that of the first bump 16 connected to the first via electrode 15. This enables the heat generated by the semiconductor device 2 to be efficiently released to the outside. Thus, the heat generated by the semiconductor device 2 is unlikely to be transferred to the acoustic wave device 1. Furthermore, the silicon oxide film 4 in the present preferred embodiment preferably has a thickness of not greater than about 2.5λ, for example, as in the first preferred embodiment. Thus, the properties of the acoustic wave device 1 are further less likely to be degraded.

At least one of the above-described width relationships may be satisfied, i.e., the width of the second via electrode 65 is larger than that of the first via electrode 15 or the width of the second bump 66 is larger than that of the first bump 16. This improves the heat dissipation properties, leading to less degradation of the properties of the acoustic wave device 1.

Figure 13:
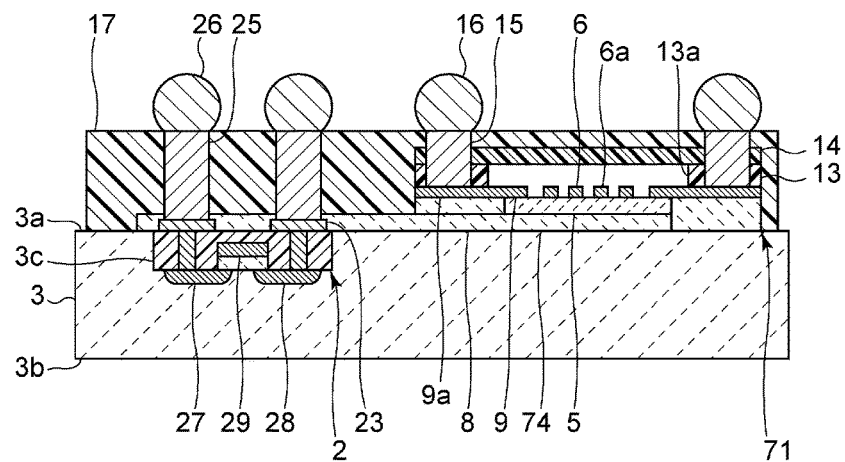
FIG. 13 is a front cross-sectional view schematically illustrating a composite device according to a fifth preferred embodiment of the present invention.

FIG. 13 is a front cross-sectional view schematically illustrating a composite device according to a fifth preferred embodiment of the present invention.

The fifth preferred embodiment differs from the first preferred embodiment in that a silicon oxide film 74 covers the semiconductor device 2 and integrally includes the protective film 24 illustrated in FIG. 1. The fifth preferred embodiment has the same or substantially the same configuration as that of the composite device 10 in the first preferred embodiment except for as described above.

In the present preferred embodiment, the properties of the acoustic wave device 71 are less likely to be degraded as in the first preferred embodiment. Furthermore, in the production process of the composite device of the present preferred embodiment, the silicon oxide film 74 is formed to cover the recess 3c and the semiconductor device 2. This eliminates an additional step of forming the protective film 24 covering the semiconductor device 2. This configuration improves the productivity while protecting the semiconductor device from being damaged.

The thickness of a portion of the silicon oxide film 74 on the piezoelectric layer 5 and the thickness of a portion of the silicon oxide film 74 covering the semiconductor device 2 may be different.

Figure 14:
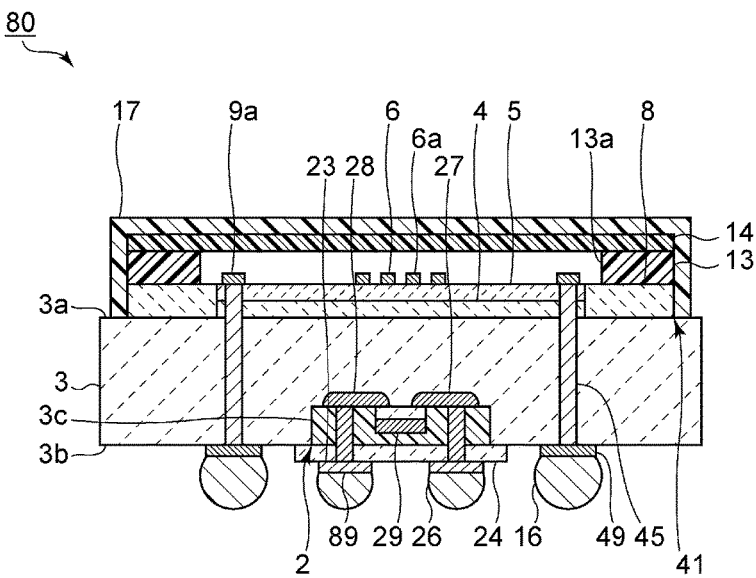
FIG. 14 is a front cross-sectional view schematically illustrating a composite device according to a sixth preferred embodiment of the present invention.

FIG. 14 is a front cross-sectional view schematically illustrating a composite device according to a sixth preferred embodiment of the present invention.

The sixth preferred embodiment differs from the second preferred embodiment in the positional relationship between the acoustic wave device 41 and the semiconductor device 2 and in that the semiconductor device 2 is not covered with the sealing resin layer 17. A composite device 80 of the present preferred embodiment has the same or substantially the same configuration as the composite device in the second preferred embodiment except for as described above.

The semiconductor device 2 of the composite device 80 is disposed adjacent to the second main surface 3b of the silicon substrate 3. The semiconductor device 2 and the acoustic wave device 41 overlap in plan view.

Specifically described, the silicon substrate 3 includes the recess 3c including an opening in the second main surface 3b. As in the second preferred embodiment, the sixth preferred embodiment includes a plurality of substrate via electrodes 45 connected to the electrode lands 9a of the acoustic wave device 41 and extending through the silicon substrate 3. The recess 3c is located between the substrate via electrodes 45 and is opposed to the IDT 6. The semiconductor device 2 is disposed in the recess 3c.

The protective film 24 covering the recess 3c and the semiconductor device 2 is disposed on the second main surface 3b of the silicon substrate 3. Electrode lands 89 electrically connected to the semiconductor device 2 are disposed on the protective film 24. The electrode lands 89 are included in the second wiring electrode 23. The second bumps 26 are connected to the electrode lands 89. When the composite device 80 according to the present preferred embodiment is mounted onto a target, such as a mounting board, the second main surface 3b of the silicon substrate 3 is disposed on the mounting board.

In the present preferred embodiment, since the acoustic wave device 41 and the semiconductor device 2 overlap in plan view, the composite device 80 is downsized. Furthermore, the silicon oxide film 4 in the present preferred embodiment preferably has a thickness of not greater than about 2.5λ, for example, as in the second preferred embodiment. Thus, the properties of the acoustic wave device 41 are further less likely to be degraded.

The semiconductor device 2 may be located so as not to overlap the IDT 6 in plan view. In such a case, a distance between the IDT 6, which is a heat source in the acoustic wave device 41, and the semiconductor device 2 is relatively long, leading to less degradation of the properties of the semiconductor device 2.

The semiconductor device 2 may preferably be a Zener diode, for example. For example, a Zener diode may be shunt-connected between an input-output signal route connecting an input terminal and an output terminal of a ladder filter and a ground. A surge voltage exceeding a threshold voltage is applied to the ground through the Zener diode when a high-frequency signal having a high-potential electrical charge is input to the input terminal. Thus, an acoustic wave resonator in the filter is unlikely to be damaged by the surge voltage.

In this configuration, the Zener diode includes a first Zener diode and a second Zener diode connected in series. The first Zener diode is located closer than the second Zener diode to the ground. The first Zener diode is positioned such that the anode is located adjacent to the input-output signal route and the cathode is located adjacent to the ground. The second Zener diode is positioned such that the anode is located adjacent to the ground and the cathode is located adjacent to the input-output signal route.

The filter to which the Zener diode is connected is not limited to the ladder filter and may be a longitudinally coupled resonator surface acoustic wave filter.

The Zener diode is produced according to an exemplary method described below.

A first N type layer is formed on a silicon substrate. A first P type layer is formed on a portion of the first N type layer. A second N type layer is formed on a portion of the first P type layer. An ohmic contact metal electrode is formed on a portion of the first N type layer having no second N type layer and no first P type layer thereon. A via is disposed on the metal electrode. The via and the wiring electrode is connected to each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite device comprising:
   a silicon substrate including a first main surface and a second main surface opposed to the first main surface;
   a semiconductor device disposed adjacent to at least one of the first main surface and the second main surface of the silicon substrate; and
   an acoustic wave device including a silicon oxide film directly or indirectly disposed on the first main surface of the silicon substrate, a piezoelectric layer directly disposed on the silicon oxide film, and an interdigital transduder (IDT) disposed on the piezoelectric layer; wherein
   the piezoelectric layer has a thickness of not greater than about 2.5λ, where λ is a wavelength defined by an electrode finger pitch of the IDT.

2. The composite device according to claim 1, further comprising a via electrode electrically connected to the IDT and extending through the silicon substrate.

3. The composite device according to claim 2, wherein
   the semiconductor device is disposed adjacent to the second main surface of the silicon substrate; and
   the semiconductor device and the acoustic wave device overlap in plan view.

4. The composite device according to claim 1, wherein
   the acoustic wave device includes a first wiring electrode electrically connected to the IDT;
   the semiconductor device includes a functional electrode and a second wiring electrode electrically connected to the functional electrode; and
   the first wiring electrode and the second wiring electrode do not overlap in plan view.

5. The composite device according to claim 1, wherein
   the semiconductor device is disposed adjacent to the first main surface of the silicon substrate; and
   a shield electrode is disposed on the second main surface of the silicon substrate over at least an area overlapping the semiconductor device in plan view.

6. The composite device according to claim 1, wherein
   the silicon substrate includes a recess including an opening in the first main surface;
   the semiconductor device is disposed in the recess; and
   the silicon oxide film covers the recess and the semiconductor device.

7. The composite device according to claim 1, wherein
the semiconductor device is disposed adjacent to the first main surface of the silicon substrate; and
a resin sealing layer is disposed on the first main surface of the silicon substrate and covers the semiconductor device and the acoustic wave device.

8. The composite device according to claim 7, further comprising:
a first via electrode electrically connected to the IDT and extending through the resin sealing layer; and
a second via electrode electrically connected to the semiconductor device and extending through the resin sealing layer; wherein
the second via electrode has a larger width than the first via electrode in a width direction extending transversely across the first via electrode and the second via electrode.

9. The composite device according to claim 7, further comprising:
a first via electrode electrically connected to the IDT and extending through the resin sealing layer;
a second via electrode electrically connected to the semiconductor device and extending through the resin sealing layer;
a first bump connected to the first via electrode; and
a second bump connected to the second via electrode; wherein
the second bump has a larger width than the first bump in a width direction extending transversely across the first via electrode and the second via electrode.

10. The composite device according to claim 1, wherein
an acoustic velocity of a bulk wave propagating through the silicon substrate is higher than an acoustic velocity of an acoustic wave propagating through the piezoelectric layer; and
an acoustic velocity of a bulk wave propagating through the silicon oxide film is lower than the acoustic velocity of the acoustic wave propagating through the piezoelectric layer.

11. The composite device according to claim 1, further comprising:
a high acoustic velocity film disposed between the silicon substrate and the silicon oxide film; wherein
an acoustic velocity of a bulk wave propagating through the high acoustic velocity film is higher than an acoustic velocity of an acoustic wave propagating through the piezoelectric layer; and
an acoustic velocity of a bulk wave propagating through the silicon oxide film is lower than the acoustic velocity of the acoustic wave propagating through the piezoelectric layer.

12. The composite device according to claim 1, further comprising:
an acoustic reflection layer including a low-acoustic-impedance layer having relatively low acoustic impedance and a high-acoustic-impedance layer having relatively high acoustic impedance, the acoustic reflection layer being disposed between the silicon substrate and the piezoelectric layer; wherein
the acoustic reflection layer includes the silicon oxide film.

13. The composite device according to claim 1, wherein the piezoelectric layer is made of lithium tantalate.

14. The composite device according to claim 13, wherein the piezoelectric layer has a cut angle of about 50°.

15. The composite device according to claim 1, wherein the silicon substrate has a thickness of not less than about $3\lambda$.

16. The composite device according to claim 15, wherein the silicon substrate has a thickness of not less than about $10\lambda$.

17. The composite device according to claim 1, wherein
the silicon substrate has a thickness of not greater than about 180 µm; and
the wavelength $\lambda$ is not greater than about 18 µm.

18. The composite device according to claim 1, wherein the semiconductor device is a Zener diode.

19. The composite device according to claim 1, wherein the IDT includes a first metal layer on the piezoelectric layer and a second metal layer on the first metal layer.

20. The composite device according to claim 19, wherein the first metal layer is made of Ti and the second metal layer is made of Al.

* * * * *